(12) United States Patent
Kawano et al.

(10) Patent No.: US 7,598,590 B2
(45) Date of Patent: Oct. 6, 2009

(54) SEMICONDUCTOR CHIP AND METHOD FOR MANUFACTURING THE SAME AND SEMICONDUCTOR DEVICE

(75) Inventors: Masaya Kawano, Kanagawa (JP);
Tsutomu Tashiro, Kanagawa (JP);
Yoichiro Kurita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 382 days.

(21) Appl. No.: 11/143,672

(22) Filed: Jun. 3, 2005

(65) Prior Publication Data

US 2006/0006493 A1    Jan. 12, 2006

(30) Foreign Application Priority Data

Jun. 30, 2004  (JP) ............................. 2004-194658

(51) Int. Cl.
*H01L 29/66* (2006.01)
(52) U.S. Cl. ........................................ 257/510; 438/294
(58) Field of Classification Search ................ 257/374, 257/510, 509, 506; 438/294
See application file for complete search history.

(56) References Cited

U.S. PATENT DOCUMENTS

| | | | | |
|---|---|---|---|---|
| 4,751,558 A * | 6/1988 | Kenney | ...................... | 257/302 |
| 5,439,835 A * | 8/1995 | Gonzalez | .................... | 438/241 |
| 5,656,525 A * | 8/1997 | Lin et al. | ....................... | 216/11 |
| 5,670,404 A * | 9/1997 | Dai | ............................. | 438/239 |
| 5,691,248 A * | 11/1997 | Cronin et al. | ............... | 438/109 |
| 5,773,326 A * | 6/1998 | Gilbert et al. | ............... | 438/154 |
| 5,811,315 A | 9/1998 | Yindeepol et al. | | |
| 6,524,928 B1 * | 2/2003 | Hirabayashi | ................ | 438/402 |
| 6,576,957 B2 | 6/2003 | Houston | | |
| 6,830,986 B2 * | 12/2004 | Yamashita et al. | .......... | 438/402 |

FOREIGN PATENT DOCUMENTS

| | | |
|---|---|---|
| CN | 1434518 A | 8/2003 |
| JP | 02-001914 A | 1/1990 |

* cited by examiner

*Primary Examiner*—Thanh V Pham
*Assistant Examiner*—Jami M Valentine
(74) *Attorney, Agent, or Firm*—Sughrue Mion, PLLC (57) ABSTRACT

The semiconductor chip 1 has a semiconductor substrate 10. In the present embodiment, the semiconductor substrate 10, which is an SOI substrate, is constituted by comprising a support substrate 12, an insulating layer 14 formed on the support substrate 12 with a layered structure, and a silicon layer 16 formed on the insulating layer 14 with the layered structure. The semiconductor substrate 10 has a circuit forming region A1 provided in the silicon layer 16. An insulating region 18 is provided on the semiconductor substrate 10. The insulating region 18 is provided so as to surround the entire side face of the circuit forming region A1.

7 Claims, 12 Drawing Sheets

SEMICONDUCTOR CHIP AND METHOD FOR MANUFACTURING THE SAME AND SEMICONDUCTOR DEVICE

This application is based on Japanese patent application NO. 2004-194,658, the content of which is incorporated hereinto by reference.

BACKGROUND OF THE INVENTION

1. Field of the Invention

The present invention relates to a semiconductor chip and a method for manufacturing the same and a semiconductor device.

2. Related Art

The Japanese Laid-Open Patent Publication No. 1990-1,914 (H02-1, 914) describes one example of the conventional semiconductor substrate. The semiconductor substrate described in the Japanese Laid-Open Patent Publication No. 1990-1,914 is an SOI (Silicon On Insulator) substrate in which a silicon layer is formed on a silicon substrate to be a support substrate via an insulating layer. The conventional semiconductor chip can be obtained in such a way as to form a predetermined circuit on the semiconductor substrate with such constitution, followed by dicing the semiconductor substrate.

SUMMARY OF THE INVENTION

However, it has now been discovered that, in the above described semiconductor chip, a silicon thin film is exposed to a side face of the chip, therefore, when heavy metals or the like are attached to the side face of the chip in the dicing step or the like, in some cases, the heavy metal or the like are diffused into the inside of a circuit forming region. Thus, diffusion of the heavy metal or the like in the circuit forming region is a factor of deterioration in reliability of the semiconductor chip. For instance, in the case that the semiconductor chip is DRAM, in some cases, a hold characteristic deterioration is brought about.

According to the present invention, there is provided a semiconductor chip comprising a semiconductor substrate having a circuit forming region, wherein the semiconductor substrate has an insulating region provided so as to surround the entire side face of the circuit forming region.

In the semiconductor chip, the insulating region to surround the entire side face of the circuit forming region is provided. Therefore, even though when heavy metals or the like are attached to a side face of the chip, it is possible to prevent the heavy metals or the like from being diffused into an inside of the circuit forming region. Consequently, the semiconductor chip with high reliability is realized.

The insulating region may be constituted by comprising a first insulating film surrounding the entire side face and a second insulating film provided so as to come into contact with the first insulating film to surround the first insulating film. Thus, the insulating region is constituted by comprising the insulating film formed into multilayered structure, therefore it is possible to more certainly prevent the heavy metals or the like from being diffused into the circuit forming region. Moreover, mechanical strength of the insulating region is improved, consequently, the mechanical strength of the entire semiconductor chip is improved.

The first insulating film may be provided so as to cover an inside face of a trench provided on the semiconductor substrate; and the second insulating film may be provided so as to embed the trench the inside face of which is covered with the first insulating film. According to the structure, it is possible to easily manufacture the insulating region that is excellent in mechanical strength.

The semiconductor substrate may have a metal film provided so as to come into contact with the insulating region so as to surround the insulating region. Therefore, it is possible more surely prevent the heavy metals or the like from being diffused into the circuit forming region. Further, the semiconductor substrate may have a second insulating region provided so as to come into contact with the metal film so as to surround the metal film. Therefore, it is possible to further surely prevent the heavy metals or the like from being diffused into the circuit forming region.

The semiconductor substrate may have a through electrode, which is provided in the circuit forming region, made of the same metal as the metal film. In manufacturing the semiconductor substrate, it is possible to form the metal film and the through electrode at the same time. Accordingly, it is possible to obtain the semiconductor chip with a structure capable of suppressing increase of the number of steps, although both the above metal film and the through electrode are provided.

The semiconductor substrate may have a third insulating region provided so as to surround the insulating region at a predetermined interval from the insulating region. Therefore, it is possible to more surely prevent the heavy metals or the like from being diffused into the circuit forming region.

The insulating region may include any of the SiN film, the SiCN film and the SiON film, or combination thereof. These films exhibit especially remarkable effect as the metal diffusion barrier, therefore, the semiconductor chip with higher reliability is realized.

According to the present invention, there is provided the semiconductor device provided with the semiconductor chip according to the present invention.

In the above semiconductor chip, as described above, it is possible to prevent the heavy metals or the like from being diffused into the circuit forming region by the insulating region, therefore, the semiconductor chip with high reliability is realized. Consequently, also in the semiconductor device, high reliability is obtained.

According to the present invention, there is provided a method for manufacturing a semiconductor chip comprising: forming an insulating region surrounding the entire side face of a circuit forming region on a semiconductor wafer having the circuit forming region; and dicing the semiconductor wafer so that at least a part of the insulating region at the side of the circuit forming region remains.

In the method for manufacturing the semiconductor chip, the semiconductor chip with a structure provided with the insulating layer so as to surround the entire side face of the circuit forming region is obtained. In the semiconductor chip with such structure, even though when the heavy metals or the like attached to the side face of the chip, it is possible to prevent the heavy metals or the like from being diffused into the inside of the circuit forming region. Consequently, it is possible to obtain the semiconductor chip with high reliability according to the manufacturing method.

The method for manufacturing the semiconductor chip may further comprise: forming a through electrode in the circuit forming region in the circuit forming region; forming a metal film coming into contact with the insulating region so as to surround this insulating region in the forming the insulating region; and dicing the semiconductor wafer such that at least a part of the metal film at the side of the circuit forming region remains in the dicing the semiconductor wafer, wherein the forming the through electrode and the forming the insulating region may performed at the same time. Therefore, it is possible to obtain the semiconductor chip with a structure provided with the metal film on the insulating region so as to surround the insulating region. Furthermore, the forming the through electrode and the forming the insulating region are performed at the same time, therefore, it is possible to obtain the semiconductor chip with such structure while preventing the number of step from increasing.

In the forming the insulating region, a third insulating region may be formed so as to surround the insulating region at a predetermined interval from the insulating region; and in the dicing the semiconductor wafer, the semiconductor wafer may be diced so that at least a part of the third insulating region at the side of the circuit forming region remains. Therefore, it is possible to obtain the semiconductor chip with a structure provided with the third insulating region so as to surround the insulating region at a predetermined interval from the insulating region.

According to the present invention, the semiconductor chip with high reliability and the method for manufacturing the same and the semiconductor device are realized.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described embodiments of a semiconductor chip and a method for manufacturing the same and a semiconductor device in detail with reference to the drawings. It should be noted that, in the explanation of the drawings, the same symbol is attached to the same element not to present duplicate explanation.

Figure 1:
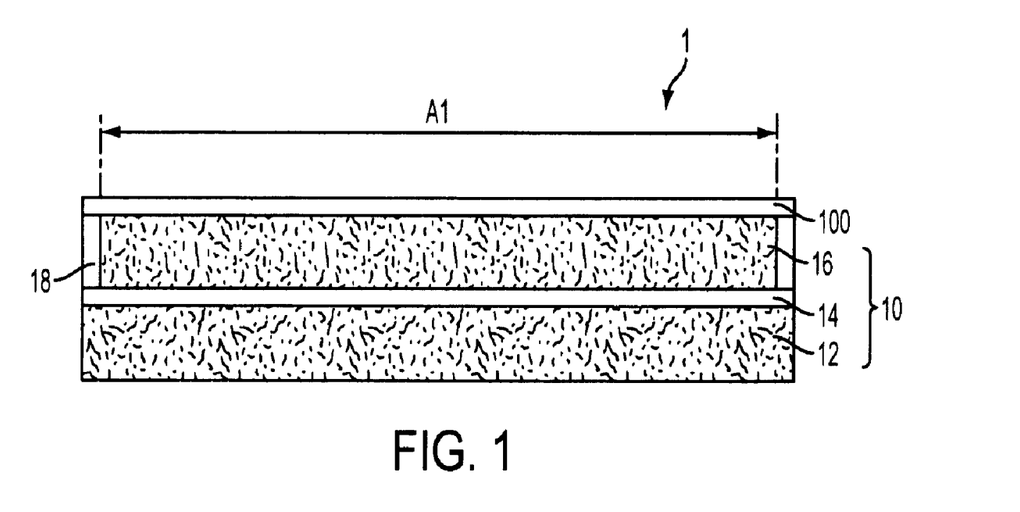
FIG. 1 is a cross sectional view schematically showing a semiconductor chip according to an embodiment.

A semiconductor chip 1 shown in FIG. 1 is provided with a semiconductor substrate 10 having a circuit forming region A1. The semiconductor substrate 10 has an insulating region 18 provided so as to surround the entire side face of the circuit forming region A1.

Figure 15:
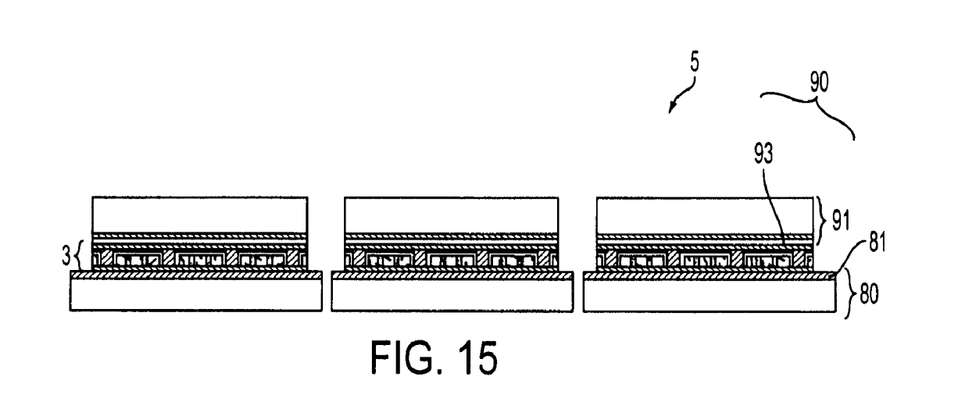
FIG. 15 is a cross sectional process view schematically showing the method for manufacturing the semiconductor device provided with the semiconductor chip according to embodiment.

The semiconductor device 5 shown in FIG. 15 is provided with the semiconductor chip 1.

A method for manufacturing the semiconductor chip 1 shown in FIG. 3, FIG. 4A, FIG. 4B and FIG. 4C comprises forming an insulating region forming the insulating region 18 so as to surround the entire side face of a circuit forming region A1 on a semiconductor wafer (support substrate 12) having the circuit forming region A1, and dicing to dice the semiconductor wafer such that at least a part of the insulating region at the side of the circuit forming region A1 remains.

First Embodiment

Figure 2:
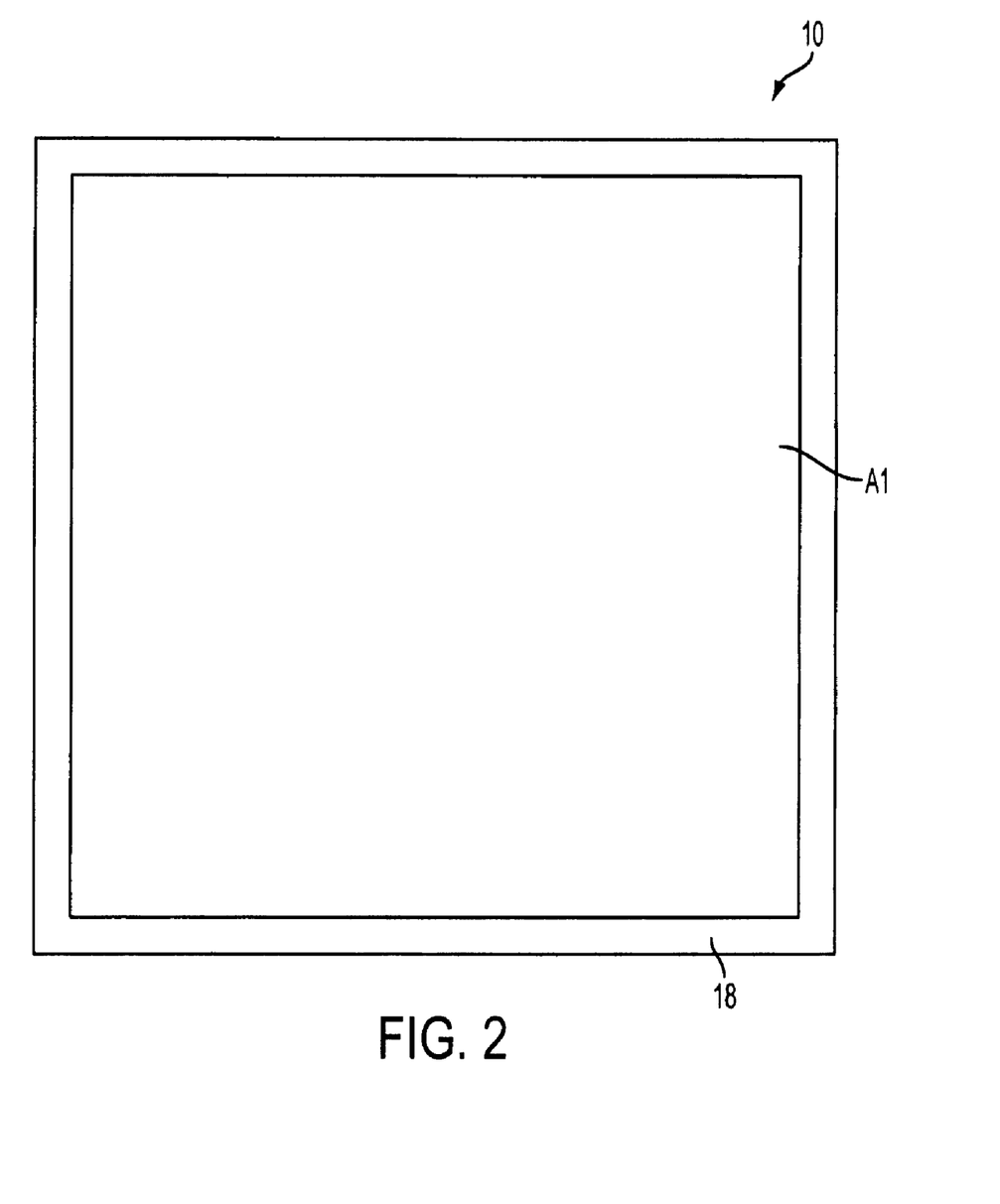
FIG. 2 is a plan view schematically showing a semiconductor substrate provided for the semiconductor chip according to the embodiment.

FIG. 1 is a cross sectional view showing a structure of the semiconductor chip 1 according to the present embodiment. FIG. 2 is a plan view showing the semiconductor substrate 10 provided for the semiconductor chip 1 shown in FIG. 1. The semiconductor chip 1 has the semiconductor substrate 10. In the present embodiment, the semiconductor substrate 10, which is an SOI substrate, is constituted by comprising a support substrate 12, an insulating layer 14 formed on the support substrate 12 with a layered structure, and a silicon layer 16 formed on the insulating layer 14 with the layered structure. As for the support substrate 12, for instance, it is possible to use a silicon substrate. Furthermore, the insulating layer 14 is constituted, for instance, with an $SiO_2$ film. The semiconductor substrate 10 has the circuit forming region A1 provided for the silicon layer 16. An interconnect layer 100 in which a predetermined circuit is formed is provided on the semiconductor substrate 10. It should be noted that various kinds of circuit element, for instance, an electrode terminal, various kinds of passive element or the like other than an interconnect may be included in addition to the interconnect layer 100. However, it is not always necessary to provide the interconnect layer 100 on the semiconductor chip 1.

The insulating region 18 is provided in the semiconductor substrate 10. As shown in FIG. 2, the insulating region 18 is provided so as to surround the entire side face of the circuit forming region A1. Here, the circuit forming region A1 is a region inside the semiconductor substrate 10 in which constituent of circuit elements is provided. The constituent of the circuit element is a diffusion layer functioning as a source-drain region of a transistor or the like. Moreover, the insulating region 18 is formed until reaching the insulating layer 14 originating from a surface of the silicon layer 16 while penetrating the silicon layer 16. The insulating region 18 is constituted with, for instance, $SiO_2$.

Figure 3:
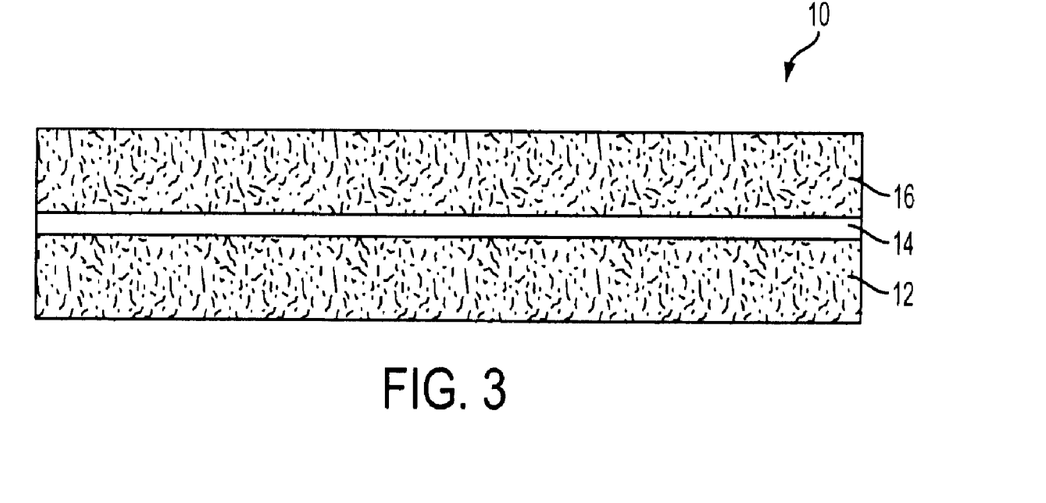
FIG. 3 is a cross sectional process view schematically showing a method for manufacturing the semiconductor chip according to the embodiment.

There will be described one example of a method for manufacturing the semiconductor chip 1 while referring to FIG. 3, FIG. 4A, FIG. 4B and FIG. 4C. Firstly, $SiO_2$ is formed on the first silicon wafer to be the support substrate 12 into the layered structure. It is suitable that film thickness of the $SiO_2$ is set to not less than 100 nm to not more than 800 nm. The second silicon wafer to be the silicon layer 16 is attached to the first silicon wafer. The second silicon wafer and the first silicon wafer are annealed in a vacuum. The semiconductor substrate 10 in which the insulating layer 14 and the silicon layer 16 are formed on the support substrate 12 with the layered structure is obtained (FIG. 3).

Figure 4A:
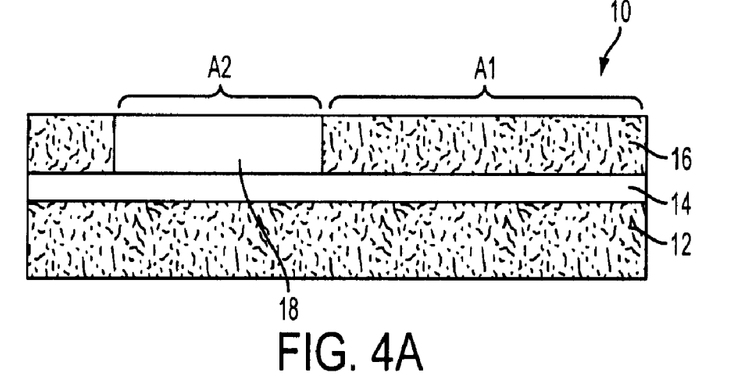
FIGS. 4A, 4B and 4C are process views schematically showing the method for manufacturing the semiconductor chip according to the embodiment.
Figure 4B:
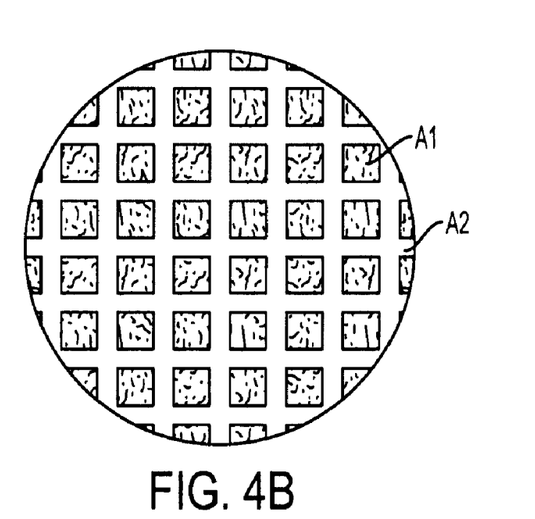

Next, a trench is formed on a scribe line region A2 of the silicon layer 16 using dry etching technique or the like. The insulating film such as an $SiO_2$ film or the like are embedded into the trench. Therefore, the insulating region 18 is formed (insulating region forming step). At this time, the insulating region 18 surrounds the entire side face of the circuit forming region A1, and the insulating region 18 is reach the insulating layer 14 from the surface of the silicon layer 16. In the present embodiment, the insulating region 18 is formed on the entire scribe line region A2 (FIG. 4A). FIG. 4B is an appearance viewing FIG. 4A from the side of the silicon layer 16.

Figure 4C:
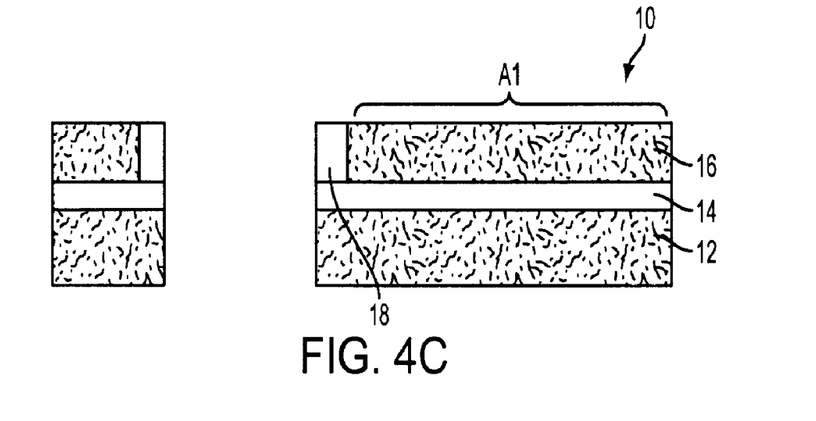

Continuously, the scribe line region A2 is diced, after forming a necessary circuit on the circuit forming region A1 (dicing step). At this time, the dicing is performed while leaving a terminal portion of the insulating region 18 such that at least a part of the insulating region 18 at the side of the circuit forming region A1 remains (FIG. 4C). According to the above process, the semiconductor chip 1 shown in FIG. 1 is obtained.

Hereinafter, there will be described effects of the present embodiment.

In the present embodiment, the insulating region 18 surrounding the entire side face of the circuit forming region A1 is provided. Therefore, the insulating region 18 functions as a metal diffusion barrier, even though the heavy metals or the like are attached to the side face of the semiconductor chip 1, it is possible to prevent the heavy metals or the like from being diffused into the inside of the circuit forming region A1. Consequently, the semiconductor chip 1 with high reliability is realized.

Moreover, also the back side face of the circuit forming region A1 is covered with the insulating layer 14. The insulating layer 14 also has the same function as the insulating region 18 in the semiconductor chip 1. For this reason, it is possible to prevent the heavy metals or the like from being diffused into the region from the back side face of the circuit forming region A1. Consequently, reliability of the semiconductor chip 1 is further improved. Moreover, in the present embodiment, the SOI substrate is employed as the semiconductor substrate 10. Therefore, it is possible to easily manufacture the semiconductor chip 1 with a structure in which the insulating layer is provided on the back side face of the circuit forming region A1.

When thickness of the insulating layer 14 is set to not less than 100 nm, it is possible to secure sufficiently coverage of the insulating layer 14. Furthermore, thickness of the insulating layer 14 is set to not more than 800 nm, it is possible to sufficiently suppress warpage occurring on the semiconductor substrate 10.

Second Embodiment

Figure 5:
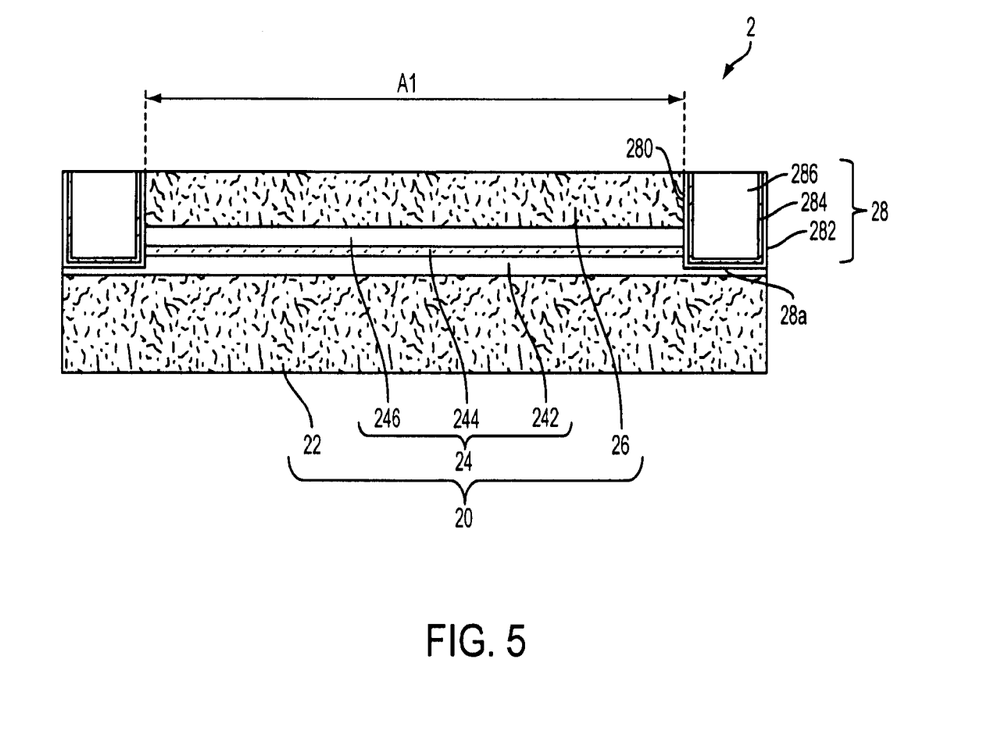
FIG. 5 is a cross sectional view schematically showing the semiconductor chip according to the embodiment.

FIG. 5 is a cross sectional view showing a structure of a semiconductor chip 2 according to the present embodiment. The semiconductor chip 2 has a semiconductor substrate 20. In the present embodiment, the semiconductor substrate 20, which is the SOI substrate, is constituted by comprising a support substrate 22, an insulating layer 24 formed on the support substrate 22 with a layered structure, and a silicon layer 26 formed on the insulating layer 24 with the layered structure. The semiconductor substrate 20 has the circuit forming region A1 provided for the silicon layer 26.

The insulating layer 24 includes a silicon oxide film 242 (a first silicon oxide film), a silicon nitride film 244, and a silicon oxide film 246 (a second silicon oxide film). That is, the insulating layer 24 is constituted as a multilayered insulating film in which the silicon oxide film 242, the silicon nitride film 244 and the silicon oxide film 246 are formed sequentially from the side of the support substrate 22 with the layered structure. The silicon oxide film 242 and the silicon oxide film 246 are, for instance, $SiO_2$ films. The silicon nitride film 244 is, for instance, a SiN film. It should be noted that a SiCN film or a SiON film, or combination thereof may be employed instead of the silicon nitride film 244 or in addition to the silicon nitride film 244.

An insulating region 28 is provided on the semiconductor substrate 20. The insulating region 28 is provided so as to surround the entire side face of the circuit forming region A1. Furthermore, the insulating region 28 is formed until reaching the insulating layer 24 originating from the surface of the silicon layer 26 while penetrating the silicon layer 26. Specifically, an end face 28a of the insulating region 28 stops the position until reaching the silicon oxide film 242 while penetrating the silicon nitride film 244. The insulating region 28 is constituted with, for instance, $SiO_2$. In the present embodiment, the insulating region 28 is constituted as the multilayered insulating film. That is, the insulating region 28, which includes a silicon oxide film 282, a silicon nitride film 284 and a silicon oxide film 286, has a structure in which the silicon oxide film 282, the silicon nitride film 284, and the silicon oxide film 286 are formed in this sequence with the layered structure. Material of the silicon oxide film 282, the silicon nitride film 284, and the silicon oxide film 286 is the same as, for instance, that of the silicon oxide film 242, the silicon nitride film 244, and the silicon oxide film 246 respectively. The silicon oxide film 282 and the silicon nitride film 284 of them are first insulating films covering an inside face of a trench 280 provided on the semiconductor substrate 20. The silicon oxide film 286 is a second insulating film provided so as to embed the trench 280 the inside face of which is covered with the first insulating film. Also, the first insulating film constituted by the silicon oxide film 282 and the silicon nitride film 284 surrounds the entire side face of the circuit forming region A1; and the second insulating film constituted by the silicon oxide film 286 surrounds the first insulating film and comes into contact with the first insulating film. It should be noted that even though the insulating region 28 does not cover strictly the entire side face in such a case where the insulating region 28 is partially notched to be provided, however, it is suitable that the entire side face is substantially covered with the insulating region 28.

Figure 6:
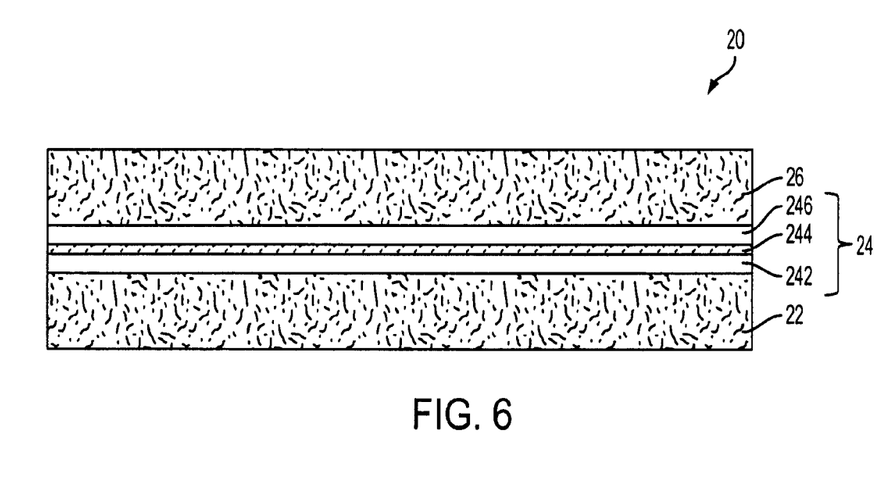
FIG. 6 is a cross sectional process view schematically showing the method for manufacturing the semiconductor chip according to the embodiment.

There will be described one example of a method for manufacturing the semiconductor chip 2 referring to FIG. 6, FIG. 7A, FIG. 7B and FIG. 7C. Firstly, $SiO_2$, SiN and $SiO_2$ are formed sequentially on a first silicon wafer to be the support substrate 22 into the layered structure. A second silicon wafer to be the silicon layer 26 is attached on the first silicon wafer, followed by being annealed in a vacuum; and the semiconductor substrate 20 in which the insulating layer 24 and the silicon layer 26 are formed on the support substrate 22 is obtained (FIG. 6).

Figure 7A:
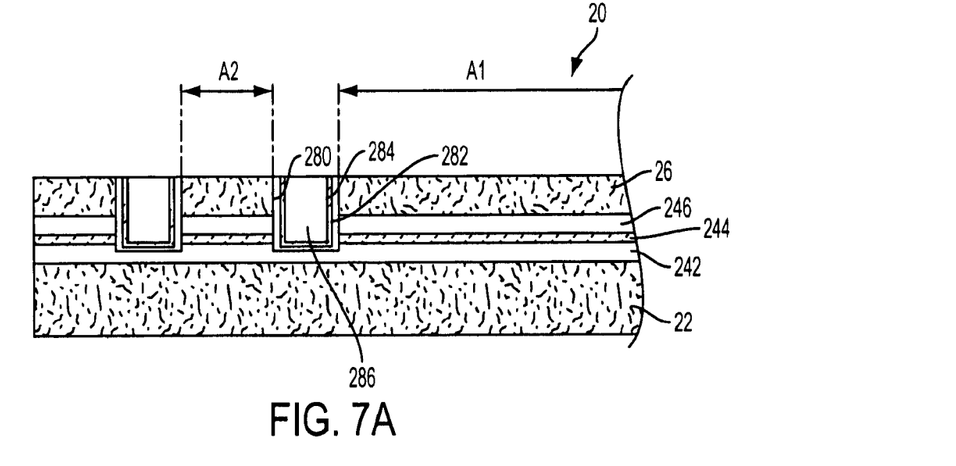
FIGS. 7A, 7B and 7C are process views schematically showing the method for manufacturing the semiconductor chip according to the embodiment.
Figure 7B:
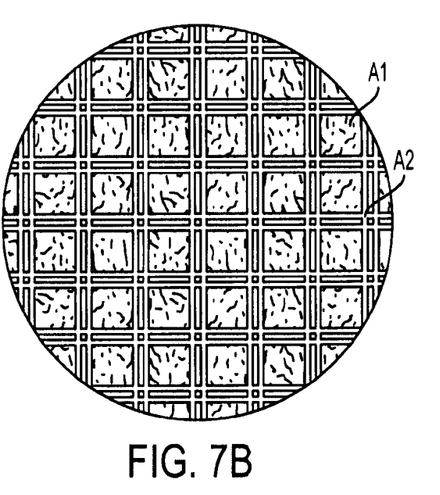

Next, the trench 280 is formed until reaching the insulating layer 24 from the surface of the silicon layer 26 using the dry etching technique or the like along the boundary between the circuit forming region A1 and the scribe line region A2. The insulating region 28 is formed upon forming the silicon oxide film 282, the silicon nitride film 284 and the silicon oxide film 286 in this sequence in the trench 280 using the CVD technique or the like (insulating region forming step) (FIG. 7A). FIG. 7B is an appearance viewing FIG. 7A from the side of the silicon layer 26.

Figure 7C:
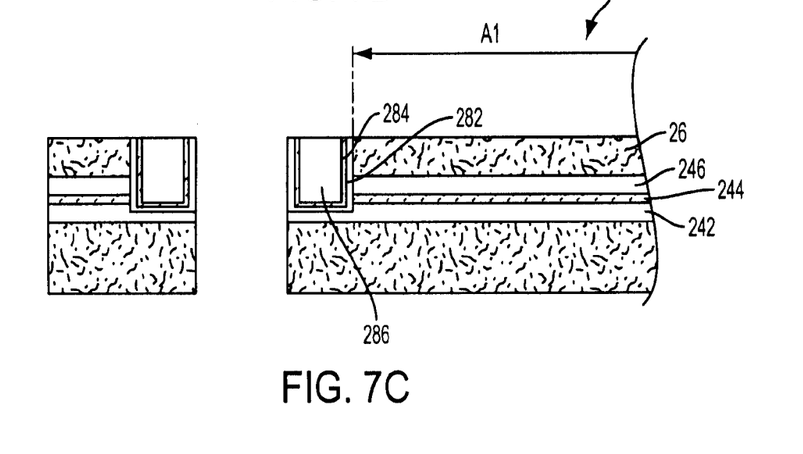

Continuously, the scribe line region A2 is diced (dicing step). At this time, the dicing is performed such that at least a part of the insulating region 28 at the side of the circuit forming region A1 remains. In the present embodiment, the dicing is performed such that the entire of the insulating region 28 remains (FIG. 7C). According to the above process, the semiconductor chip 2 shown in FIG. 5 is obtained.

Hereinafter, there will be described effects of the present embodiment.

Also, in the present embodiment, there is provided the insulating region 28 surrounding the entire side face of the circuit forming region A1. For this reason, even though the heavy metals or the like are attached to the side face of the semiconductor chip 2, it is possible to prevent the heavy metals or the like from being diffused into the inside of the circuit forming region A1. Consequently, the semiconductor chip 2 with high reliability is realized.

Furthermore, as described above, the insulating region 28 includes the first insulating film (silicon oxide film 282 and silicon nitride film 284) and the second insulating film (silicon oxide film 286). Therefore, it is possible to prevent the heavy metal or the like from being diffused into the inside of the circuit forming region A1 more certainly. Furthermore, mechanical strength of the insulating region 28 is improved, consequently, mechanical strength of the semiconductor chip 2 is improved. Moreover, the first insulating film itself is constituted as the multilayered film including the silicon oxide film 282 and the silicon nitride film 284, therefore, the mechanical strength is further improved. However, the first insulating film may be constituted as a single layered film.

The first insulating film is provided so as to cover the inside face of the trench 280; and the second insulating film is provided so as to embed the trench 280 the inside face of which is covered with the first insulating film. According to the structure, it is possible to easily manufacture the insulating region 28 that is excellent in mechanical strength.

The insulating region 28 includes the silicon nitride film, therefore, particularly, it is possible to function preferably as the metal diffusion barrier. The SiN of the all silicon nitride films is especially excellent as the metal diffusion barrier.

Also, the insulating layer 24 covering the back side face of the circuit forming region A1 includes the silicon nitride film 244. Therefore, particularly, also the insulating layer 24 functions preferably as the metal diffusion barrier. Moreover, the insulating region 28 and the insulating layer 24 are capable of functioning preferably as the metal diffusion barrier in the case that the insulating region 28 and the insulating layer 24 include also the SiON film or the SiCN film.

Third Embodiment

Figure 8:
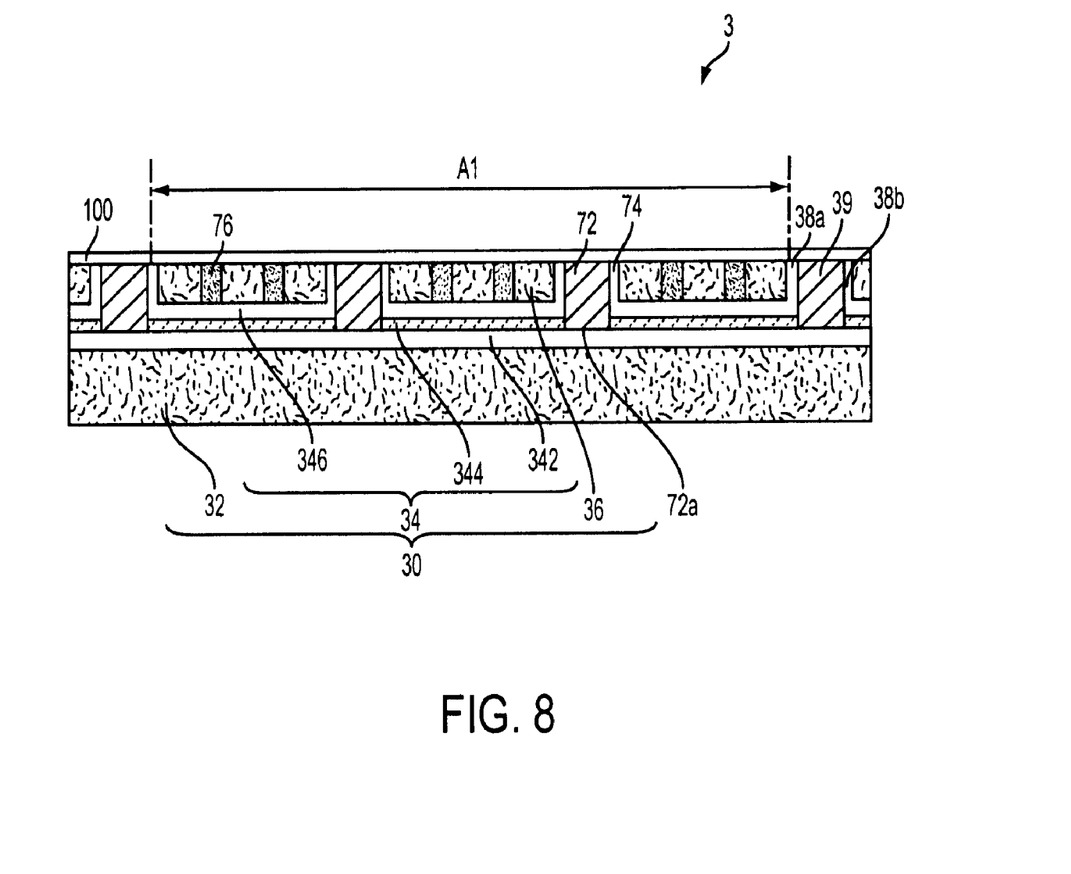
FIG. 8 is a cross sectional view schematically showing the semiconductor chip according to the embodiment.
Figure 9:
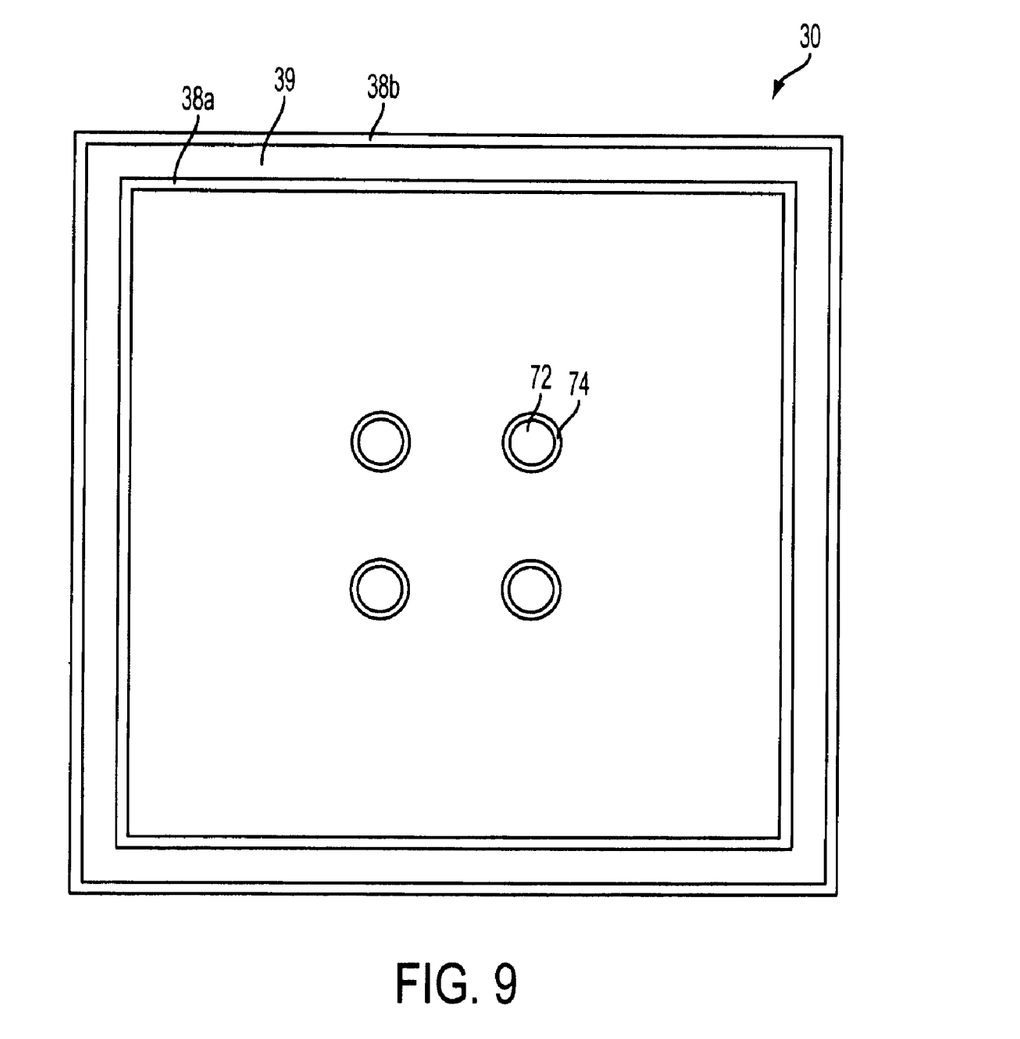
FIG. 9 is a plan view schematically showing the semiconductor substrate provided for the semiconductor chip according to the embodiment.

FIG. 8 is a cross sectional view showing a structure of a semiconductor chip 3 according to the present embodiment. FIG. 9 is a plan view showing a semiconductor substrate 30 provided for the semiconductor chip 3 shown in FIG. 8. The semiconductor chip 3 has the semiconductor substrate 30. In the present embodiment, the semiconductor substrate 30, which is the SOI substrate, is constituted by comprising a support substrate 32, an insulating layer 34 formed on the support substrate 32 with the layered structure, and a silicon layer 36 formed on the insulating layer 34 with the layered structure. The semiconductor substrate 30 has the circuit forming region A1 provided on the silicon layer 36. The insulating layer 34, like the insulating layer 24 shown in FIG. 5, is constituted as the multilayered film composed of a silicon oxide film 342, a silicon nitride film 344 and a silicon oxide film 346. The interconnect layer 100 on which a predetermined circuit is formed is provided on the semiconductor substrate 10.

An insulating region 38a is provided on the semiconductor substrate 30. The insulating region 38a, which is, for instance, an $SiO_2$ film, is provided so as to surround the entire side face of the circuit forming region A1. Furthermore, the insulating region 38a is formed until reaching the insulating layer 34 originating from a surface of the silicon layer 36 while penetrating the silicon layer 36. In the present embodiment, a metal film 39 is provided on the semiconductor substrate 30. The metal film 39 surrounds the insulating region 38a, and comes into contact with the insulating region 38a. Furthermore, the metal film 39 is formed until reaching the insulating layer 34 while penetrating the silicon layer 36. Moreover, an insulating region 38b (second insulating region) is provided on the semiconductor substrate 30. The insulating region 38b, which is, for instance, an $SiO_2$ film, surrounds the metal film 39 and comes into contact with the metal film 39. Also, the insulating region 38b is formed until reaching the insulating layer 34 originating from the surface of the silicon layer 36 while penetrating the silicon layer 36. As shown in FIG. 9, the whole of the insulating region 38a, the insulating region 38b and the metal film 39 are provided so as to surround the entire side face of the circuit forming region A1.

A through electrode 72 is provided in the circuit forming region A1. The through electrode 72 is formed until reaching the insulating layer 34 from the silicon layer 36. Specifically, the through electrode 72 extends until the inside of the insulating layer 34 originating from the surface of the silicon layer 36 while penetrating the silicon layer 36. Here, an end face 72a of the through electrode 72 at the side of the insulating layer 34 stops inside the insulating layer 34. In the present embodiment, the position of the end face 72a is the approximately same as a position of a face of the silicon nitride film 344 at the side of the support substrate 32 (that is, a face opposite to the silicon layer 36). As for material of the through electrode, it is possible to employ, for instance, Cu, W, Al or polysilicon; and it is suitable to employ the same metal as the metal film 39. A side face of the through electrode 72 is covered with the insulating film 74 constituted by such as $SiO_2$ or the like.

Furthermore, a polysilicon plug 76 is provided in the circuit forming region A1. The polysilicon plug 76 is formed so as to penetrate the silicon layer 36. In the present embodiment, plural polysilicon plugs 76 are provided.

Figure 10:
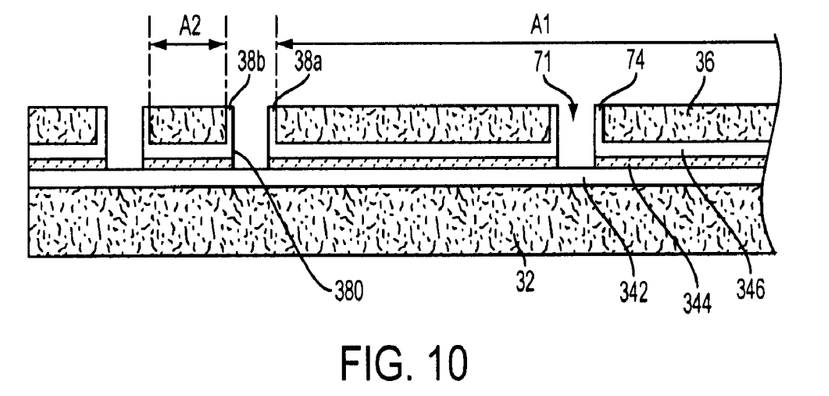
FIG. 10 is a cross sectional process view schematically showing the method for manufacturing the semiconductor chip according to the embodiment.

There will be described one example of a method for manufacturing the semiconductor chip 3 while referring to FIG. 10 and FIG. 11. Firstly, the semiconductor substrate 30 in which the insulating layer 34 and the silicon layer 36 are formed on the support substrate 32 with the layered structure is prepared. The semiconductor substrate 30 is capable of being manufactured using the same process as the semiconductor substrate 20 shown in FIG. 6.

Next, a trench 380 is formed until reaching the insulating layer 34 from the silicon layer 36 on a predetermined position of the semiconductor substrate 30 using, for instance, dry etching technique. In the present embodiment, a hole 71 for the through electrode 72 is formed at the same time as forming the trench 380. Here, etching condition is set such that the etching stops on the boundary between the silicon oxide film 342 and the silicon nitride film 344 so that the end face 72a (referring to FIG. 8) of the through electrode 72 stops inside the insulating layer 34. Further, the insulating region 38a, the insulating region 38b and insulating film 74 are formed upon heating and oxidizing the silicon layer 36 under this condition (FIG. 10). It should be noted that the hole 71 may be a trench.

Figure 11:
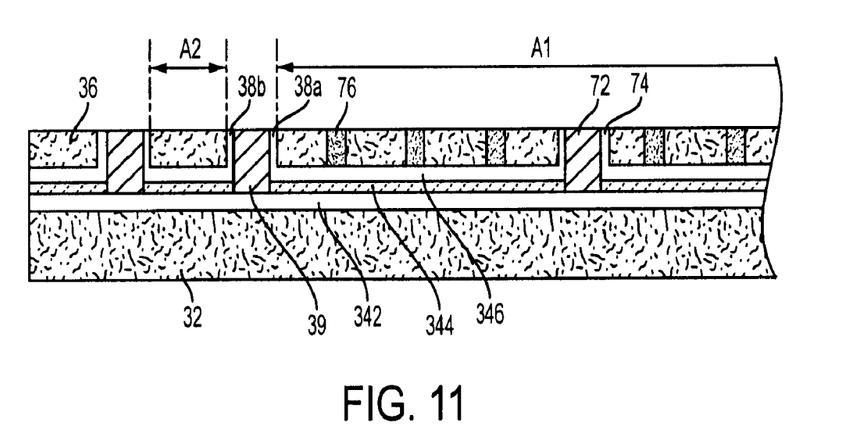
FIG. 11 is a cross sectional process view schematically showing the method for manufacturing the semiconductor chip according to the embodiment.

Next, the metal film 39 is formed so as to surround the insulating region 38a upon embedding metal into the trench 380 (FIG. 11). In the present embodiment, the steps including until forming the metal film 39 from forming the insulating region 38a and the insulating region 38b are called as an insulating region forming step. In the present step, the through electrode 72 is formed upon embedding the metal into the hole 71 at the same time as embedding the trench 380 (through electrode forming step). Embedding the metal is performed in such a way that a film of Cu or W is deposited using a plating technique or CVD technique after forming a barrier metal such as, for instance, TiN, TaN or Ta or the like. Further, the metal film deposited other than the inside of the trench 380 and the inside of the hole 71, and the insulating film on the silicon layer 36 are removed. Furthermore, the polysilicon plug 76 is formed on a predetermined position of the silicon layer 36.

Continuously, the scribe line region A2 is diced, after forming necessary circuit on the circuit forming region A1 of the semiconductor substrate 30 (dicing step). At this time, the dicing is performed such that at least a part of the metal film 39 at the side of the circuit forming region A1 remains. In the present embodiment, the dicing is performed in such a way that the whole of the metal film 39, and further, also the whole of the insulating region 38b remain. According to the above process, the semiconductor chip 3 shown in FIG. 8 is obtained.

Figure 12:
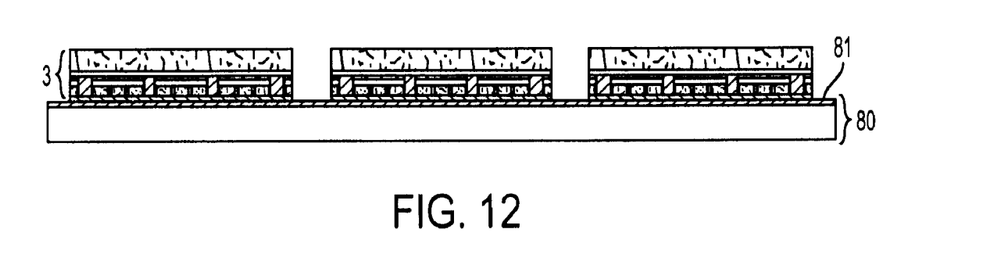
FIG. 12 is a cross sectional process view schematically showing the method for manufacturing a semiconductor device provided with the semiconductor chip according to the embodiment.

Further, there will be described one example of the method for manufacturing the semiconductor device 5 provided with the semiconductor chip 3 while referring to FIGS. 12 to 15. Firstly, a base wafer 80 having an interconnect layer 81 on a surface thereof is prepared; and the semiconductor chip 3 is formed on the base wafer 80 into a layered structure (FIG. 12). Here, the interconnect layer 81 and the interconnect layer 100 (FIG. 1) are faced to each other. It is possible to employ, for instance, a surface activated bonding method bonding the base wafer 80 and the semiconductor chip 3. The surface activated bonding method flattens the bonding face between the base wafer 80 and the semiconductor chip 3 using a CMP technique (Chemical Mechanical Polishing method) or the like. Then, the bonding is performed with the condition such that the opposite electrodes and the opposite insulating films are activated using plasma irradiation technique or the like. It should be noted that it is suitable to perform the bonding between electrodes and the resin sealing while using the general flip chip bonding method. In the present embodiment, plural semiconductor chips 3 are formed on the base wafer 80 at a predetermined interval, into a layered structure. This interval is set larger than thickness of a dicing blade employed in a step for dicing the base wafer 80 at the later step.

Figure 13:
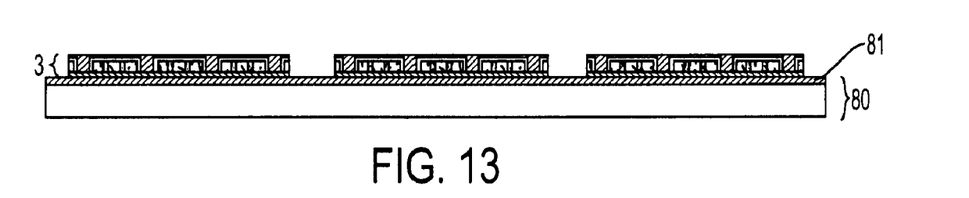
FIG. 13 is a cross sectional process view schematically showing the method for manufacturing the semiconductor device provided with the semiconductor chip according to the embodiment.

Continuously, the support substrate 32 is removed from the semiconductor substrate 30 using, for instance, wet etching technique (support substrate removing step). At this time, also the silicon oxide film 342 is removed together with the support substrate 32 such that the end face 72a of the through electrode 72 is exposed (FIG. 13). It should be noted that, in the support substrate removing step, it is suitable to remove the support substrate 32 using grinding technique or CMP technique, or combination thereof in addition to the wet etching technique.

Figure 14:
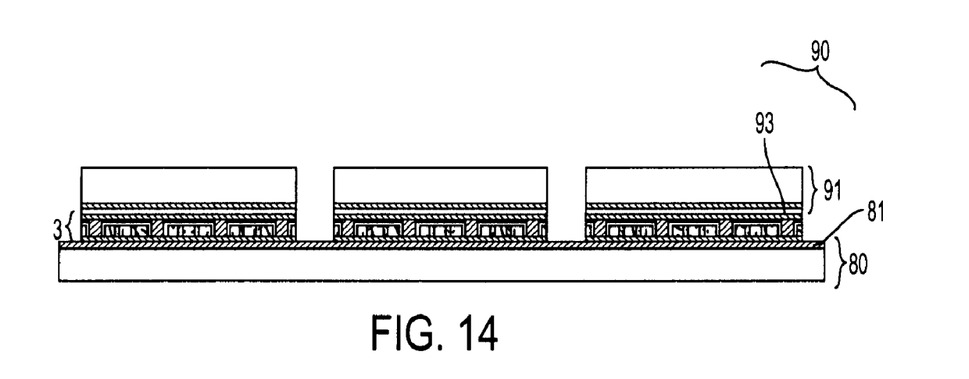
FIG. 14 is a cross sectional process view schematically showing the method for manufacturing the semiconductor device provided with the semiconductor chip according to the embodiment.

Further, a second semiconductor chip 90 in which an interconnect layer 93 is provided on an SOI substrate 91 is prepared; and the second semiconductor chip 90 is formed on the semiconductor chip 3 into the layered structure. Here, the interconnect layer 93 is faced to the semiconductor chip 3 to each other (FIG. 14).

Lastly, the semiconductor device 5 provided with the semiconductor chip 3 is obtained upon performing the dicing of the region where the semiconductor chip 3 is not provided in the base wafer 80 (FIG. 15).

As shown in FIG. 15, the semiconductor device 5 has a structure provided with the semiconductor chip 3. In the present embodiment, there has been described a structure in which the semiconductor device 5 is provided with the semiconductor chip 3. However, also it is effective that the semiconductor device 5 has the semiconductor device 1 and the semiconductor device 2 described in the above embodiment, and it is also effective that the semiconductor device 5 has a semiconductor device 4 described later.

Hereinafter, there will be described effects of the present embodiments.

Also in the present embodiment, the insulating region 38a surrounding the entire side face of the circuit forming region A1 is prepared. For this reason, even though heavy metals or the like are attached to the side face of the semiconductor chip 3, it is possible to prevent the heavy metals or the like from being diffused into the inside of the circuit forming region A1. Consequently, the semiconductor chip 3 with high reliability is realized.

The semiconductor substrate 30 has the metal film 39 provided so as to come into contact with the insulating region 38a so as to surround the insulating region 38a. Therefore, it is possible to surely prevent the heavy metals or the like from being diffused into the circuit forming region A1. Further, the semiconductor substrate 30 has the insulating region 39b provided so as to come into contact with the metal film 39 so as to surround the metal film 39. Therefore, it is possible to more surely prevent the heavy metals or the like from being diffused into the circuit forming region A1.

When the through electrode 72 and the metal film 39 are made of the same metal, it is possible to form the metal film 39 and the through electrode 72 at the same step. Actually, in the above manufacturing process, the insulating region forming step and the through electrode forming step are preformed at the same time. Consequently, it is possible to obtain the semiconductor chip 3 provided with both the metal film 39 and the through electrode 72 while suppressing increase of the number of the step.

Furthermore, in the present embodiment, the end face 72a of the through electrode 72 stops inside the insulating layer 34. That is, a configuration results in a state where the end face 72a does not project from the insulating layer 34. For this reason, a possibility that the through electrode 72 receives damage is small when removing the support substrate 32 in the support substrate removing step. Consequently, the semiconductor chip 3 with high reliability and the semiconductor device 5 provided with the semiconductor chip 3 with high reliability are realized. However, it is not always necessary that the end face 72a of the through electrode 72 stops inside the insulating layer 34; so, it is suitable that the end face 72a may be projected at the side of the support substrate 32 while penetrating the insulating layer 34.

Further, the insulating layer 34 includes the silicon nitride film 344, therefore, it is possible to easily realize a structure in which the end face 72a of the through electrode 72 stops inside the insulating layer 34 while causing the silicon nitride film 344 to function as an etching stopper.

The insulating layer 34 includes the silicon oxide film 342, therefore, it is possible to more easily realize a structure in which the end face 72a of the through electrode 72 stops inside the insulating layer 34 due to etching selectivity between the silicon nitride film 344 and the silicon oxide film 342.

The polysilicon plug 76 is provided in the silicon layer 36. Therefore, in the semiconductor chip 3, impurity gettering is performed depending on the polysilicon plug 76.

Fourth Embodiment

Figure 16:
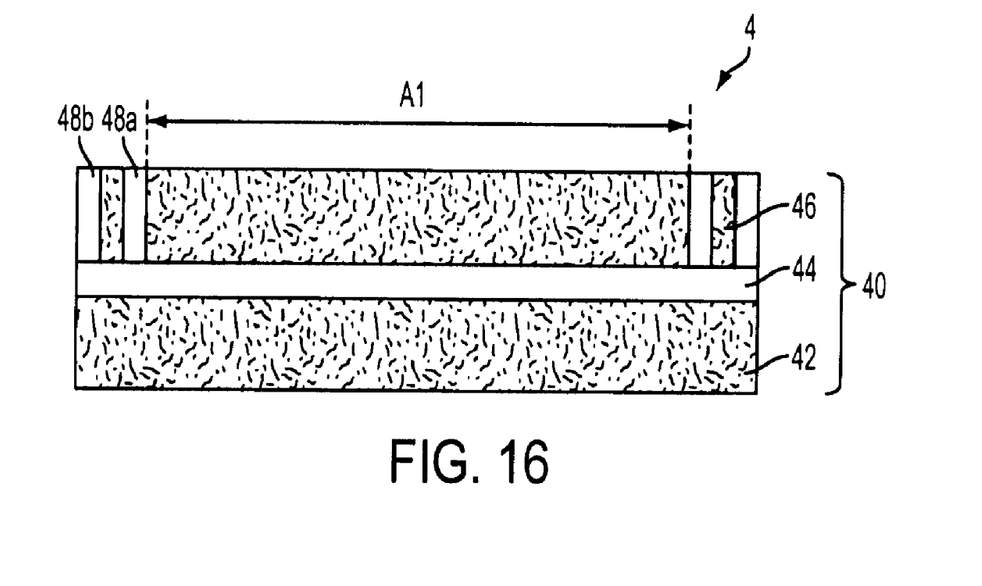
FIG. 16 is a cross sectional view schematically showing the semiconductor chip according to the embodiment.

FIG. 16 is a cross sectional view showing a structure of a semiconductor chip 4 according to the present embodiment. The semiconductor chip 4 has a semiconductor substrate 40. In the present embodiment, the semiconductor substrate 40, which is the SOI substrate, is constituted by comprising a support substrate 42, an insulating layer 44 formed on the support substrate 42, and a silicon layer 46 formed on the insulating layer 44. The semiconductor substrate 40 has the circuit forming region A1 provided for the silicon layer 46.

Figure 17:
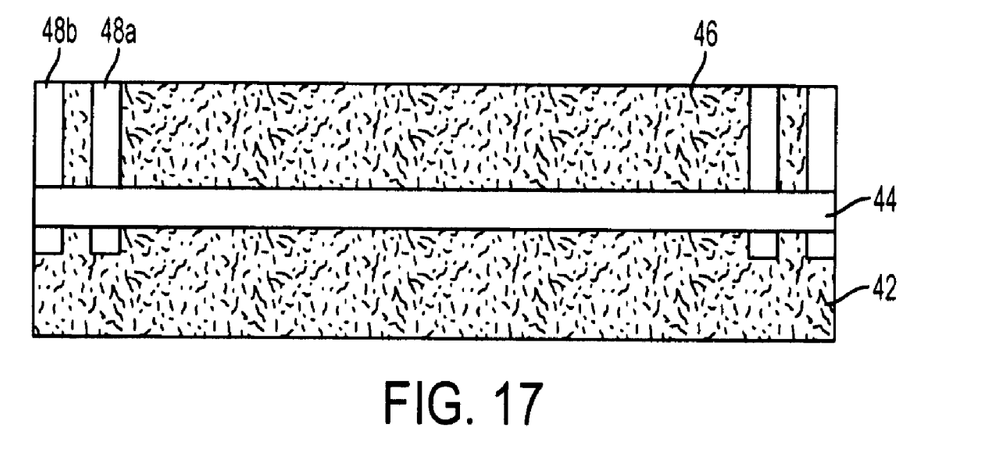
FIG. 17 is a cross sectional view schematically showing the semiconductor chip according to the embodiment.

An insulating region 48a is provided in the semiconductor substrate 40. The insulating region 48a, which is, for instance, the SiO$_2$ film, is provided so as to surround the entire side face of the circuit forming region A1. Furthermore, the insulating region 48a is formed until reaching the insulating layer 44 originating from a surface of the silicon layer 46 while penetrating the silicon layer 46. In the present embodiment, an insulating region 48b (third insulating region) is provided in the semiconductor substrate 40. The insulating region 48b, which is provided at a predetermined interval from the insulating region 48a, surrounds the insulating region 48a. Moreover, the insulating region 48b penetrates the silicon layer 46 until reaching the insulating layer 44. It should be noted that, as shown in FIG. 17, it is suitable that the insulating region 48a and the insulating region 48b may project to the side of the support substrate 42 while penetrating the insulating layer 44.

Figure 18:
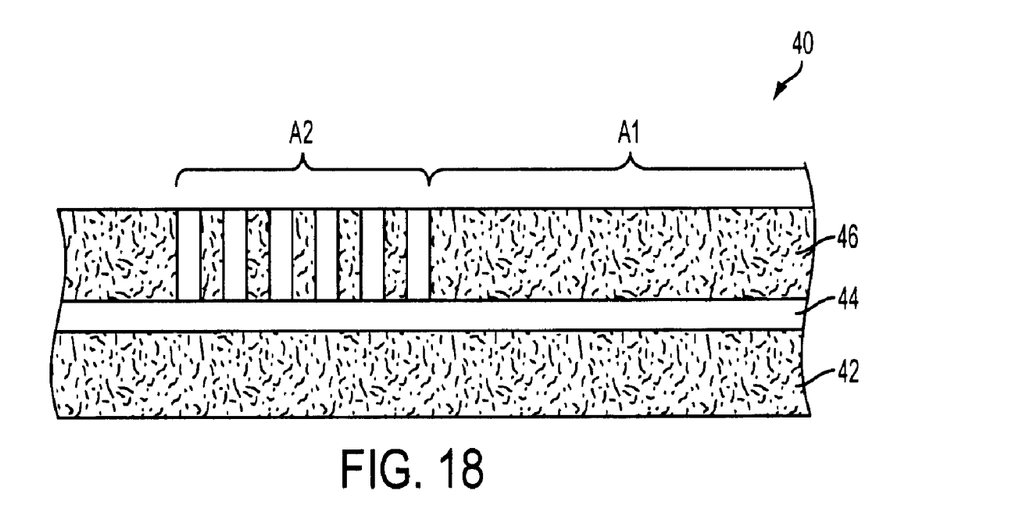
FIG. 18 is a cross sectional process view schematically showing the method for manufacturing the semiconductor chip according to the embodiment.
Figure 19:
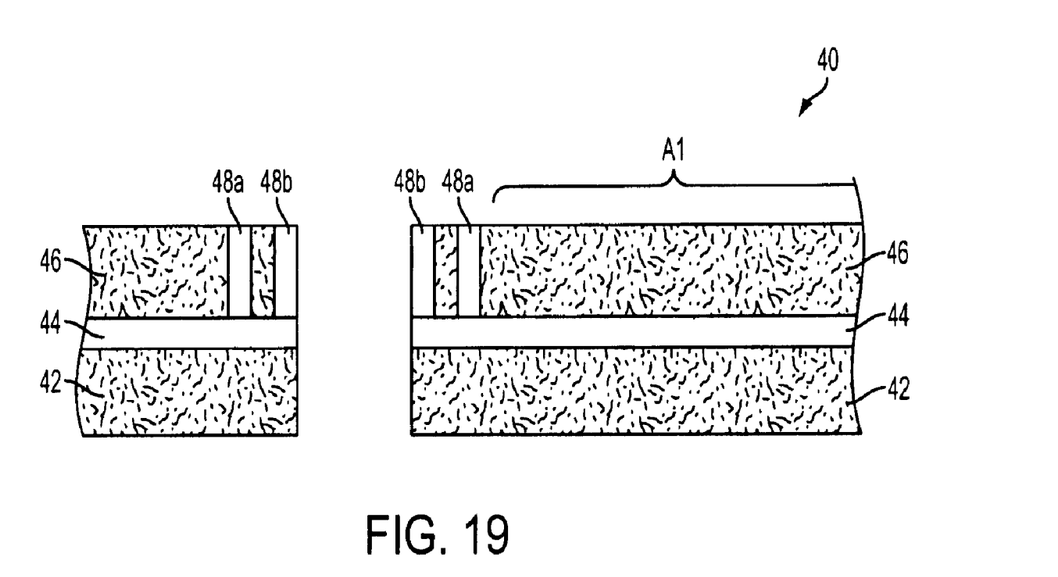
FIG. 19 is a cross sectional process view schematically showing the method for manufacturing the semiconductor chip according to the embodiment.

There will be described one example of the method for manufacturing the semiconductor chip 4 referring to FIG. 18 and FIG. 19. Firstly, the semiconductor substrate 40 in which the insulating layer 44 and the silicon layer 46 are formed on the support substrate 42 with the layered structure is prepared.

The semiconductor substrate 40 is capable of being manufactured using the same method as the semiconductor substrate 10 shown in FIG. 3.

Next, at least two trenches including a trench to be the insulating region 48a and a trench to be the insulating region 48b are formed on the scribe line region A2 of the silicon layer 46 using the dry etching technique or the like. Thereafter, the insulating region 48a and the insulating region 48b are formed upon embedding the insulating film such as an SiO$_2$ film or the like into the trench. Here, the insulating region 48b is formed so as to surround the insulating region 48a at a predetermined interval from the insulating region 48a (insulating region forming step). Here, the insulating region 48a and the insulating region 48b surround the entire side face of the circuit forming region A1, and also the insulating region 48a and the insulating region 48b are formed until reaching the insulating layer 44 from the surface of the silicon layer 46 (FIG. 18).

Continuously, the scribe line region A2 is diced (dicing step). Here, the dicing is performed in such a way that at least a part of the insulating region 48b at the side of the circuit forming region A1 remains. In the present embodiment, the dicing is performed such that the whole of the insulating region 48b at the side of the circuit forming region A1 remains (FIG. 19). According to the above process, the semiconductor chip 4 shown in FIG. 16 is obtained.

Hereinafter, there will be described effects of the present embodiment.

Also in the present embodiment, the insulating region 48a surrounding the entire side face of the circuit forming region A1 is provided. For this reason, even though the heavy metals or the like are attached to the side face of the semiconductor chip 4, it is possible to prevent the heavy metals or the like from being diffused into the inside of the circuit forming region A1. Consequently, the semiconductor chip 4 with high reliability is realized.

The semiconductor substrate 40 has the insulating region 48b provided so as to surround the insulating region 48a at a predetermined interval from the insulating region 48a. Therefore, it is possible to more certainly prevent the heavy metals or the like from being diffused into the circuit forming region A1. It should be noted that, in the present embodiment, exemplification is that two insulating regions of the insulating region 48a and the insulating region 48b are provided, however it is suitable that not less than three insulating regions may be provided.

While the embodiments of the present invention have been described above in reference to the annexed figures, it should be understood that the descriptions above are presented for the purpose of illustrating the present invention, and various configurations other than the above-described configurations can also be adopted.

It is apparent that the present invention is not limited to the above embodiment that modified and changed without departing from the scope and sprit of the invention.

What is claimed is:

1. A semiconductor chip comprising:
a semiconductor substrate having a circuit forming region,
wherein said semiconductor substrate has an insulating layer contacting a bottom face of said circuit forming region and a first insulating region surrounding the entire side face of said circuit forming region, and
wherein said semiconductor substrate comprises a metal film contacting said first insulating region and surrounding said first insulating region.

2. The semiconductor chip according to claim 1, wherein said semiconductor substrate further comprises a second insulating region contacting said metal film and surrounding said metal film.

3. The semiconductor chip according to claim 1, wherein said semiconductor substrate further comprises a through electrode, which is provided in said circuit forming region and comprising a same metal as said metal film.

4. The semiconductor chip according to claim 1, wherein said first insulating region comprises an SiN film.

5. The semiconductor chip according to claim 1, wherein said first insulating region comprises a first silicon oxide film, a silicon nitride film and a second silicon oxide film which are sequentially formed.

6. A semiconductor device which is provided with the semiconductor chip according to claim 1.

7. The semiconductor device according to claim 1, wherein said insulating region contacts said insulating layer.

* * * * *